United States Patent
Sze et al.

(10) Patent No.: US 7,209,017 B2
(45) Date of Patent: Apr. 24, 2007

(54) SYMMETRICAL LINEAR VOLTAGE CONTROLLED OSCILLATOR

(75) Inventors: Bour-Yi Sze, Taichung (TW); Chih-Long Ho, Taipei (TW); Ming-Chieh Huang, Taoyuan (TW)

(73) Assignee: VIA Technologies, Inc., Taipei (TW)

( * ) Notice: Subject to any disclaimer, the term of this patent is extended or adjusted under 35 U.S.C. 154(b) by 164 days.

(21) Appl. No.: 11/048,456

(22) Filed: Jan. 31, 2005

(65) Prior Publication Data

US 2006/0028283 A1 Feb. 9, 2006

Related U.S. Application Data

(60) Provisional application No. 60/599,260, filed on Aug. 4, 2004.

(51) Int. Cl.
*H03B 5/12* (2006.01)
(52) U.S. Cl. .................................. 331/179; 331/117 R
(58) Field of Classification Search ............ 331/117 R, 331/179, 117 FE
See application file for complete search history.

(56) References Cited

U.S. PATENT DOCUMENTS

| 5,434,543 A | 7/1995 | Brilka et al. ............ 331/117 R |
| 6,784,753 B2 * | 8/2004 | Leenaerts et al. ......... 331/36 C |
| 2004/0066243 A1 * | 4/2004 | Gutierrez ................ 331/117 R |

* cited by examiner

*Primary Examiner*—Joseph Chang
(74) *Attorney, Agent, or Firm*—Kirkpatrick & Lockhart Preston Gates Ellis LLP

(57) ABSTRACT

A system is provided to improve frequency stability and system linearity in voltage controlled oscillators. A symmetrical voltage controlled oscillator system embodying the present invention comprises a frequency tuning circuit for receiving a frequency tuning signal, a band tuning circuit coupled with the frequency tuning circuit in a parallel fashion having at least one switching circuit for receiving at least one band tuning signal and at least one switching signal, a core circuit coupled with the frequency tuning circuit and the band tuning circuit for providing a first output and a second output that are complementary to each other, wherein upon asserting the switching signal, and upon adjusting the frequency tuning signal and the band tuning signal, the switching circuit is enabled for configuring the band tuning circuit to join the frequency tuning circuit for determining a predetermined output frequency based on a total inductance and total capacitance provided by the core circuit, the frequency tuning circuit and the band tuning circuit.

17 Claims, 6 Drawing Sheets

SYMMETRICAL LINEAR VOLTAGE CONTROLLED OSCILLATOR

CROSS REFERENCE

This application claims the benefits of U.S. Provisional Patent Application Ser. No. 60/599,260, filed on Aug. 4, 2004, and entitled "HIGHLY LINEAR SIGNAL MODULATION VOLTAGE-CONTROLLED OSCILLATOR". This application further relates to co-pending applications entitled "HIGHLY-LINEAR SIGNAL-MODULATED VOLTAGE CONTROLLED OSCILLATOR" filed on Jan. 31, 2005, under Ser. No. 11/047,835, and "SIGNAL MODULATED VOLTAGE CONTROLLED OSCILLATOR SYSTEM", filed on Jan. 31, 2005, under Ser. No. 11/048,151.

BACKGROUND

The present invention relates generally to semiconductor voltage controlled oscillator (VCO) devices, and more particularly to improved designs of highly linear inductance-capacitance tank VCO devices.

The popularity of mobile telephones has placed exceptional attention to wireless architectures and circuit techniques. In addition, the reduction in scaling of complementary metal-oxide semiconductor (CMOS) technologies in recent years has resulted in significant improvements in the radio frequency (RF) performance of MOS devices. As an example of the CMOS RF technology improvements, single-chip transceiver designs have already been demonstrated using low-cost CMOS technology. RF CMOS integrated circuit (IC) technology has advanced to the point of commercial deployment.

One of the key elements of the wireless communications transceivers is voltage controlled oscillators (VCOs). They are part of the frequency synthesizer that generates the local oscillator (LO) signal for both up-conversion and down-conversion of the baseband signal. For monolithic integration into CMOS devices, inductance-capacitance (LC) tank oscillators are preferred over other oscillators due to its better relative phase noise performance and its low power consumption. Despite continuous improvements in VCOs, however, VCO design still remains both a bottleneck and the main challenge for RF transceiver design. These challenges include reducing phase noise, power consumption, and optimizing frequency tuning range. In LC tank VCOs, phase noise and power consumption depend primarily on the quality factor (Q) of the tank and the non-linearities of varactors, which are specially-designed P-N junction diodes, whose capacitance change significantly in the reverse bias mode. There are numerous varactor types: PN-junction, standard mode p/nMOS, or accumulation mode p/nMOS varactors. The frequency tuning range is determined by the capacitance tuning range of the varactor and the parasitic characteristics of the VCO. Therefore, the main task is to optimize the performance of the inductors and varactors. The control voltage applied to the VCO changes the capacitance value of the varactor, which determines the oscillation frequency of the VCO. The inductance, L, and the parallel capacitance, C, determine the oscillation frequency, f, of the VCO by the following equation:

$$f=1/2\pi(LC)^{1/2}$$

Varactors are used to cover a certain frequency band. The active devices of the VCO overcome the losses in the tank. To reduce the phase noise of the VCO, the passive elements of the tank need to have large quality (Q) factors, since the quality factors of the tank quadratically influence the phase noise of the VCO. At frequencies suitable for mobile communications, the quality factors of integrated inductors are usually much lower than the quality factors of conventional diodes or MOS varactors. In these applications, the inductors determine the worst-case phase noise and whether or not the VCO specifications can be met.

The performance of integrated inductors is strongly influenced by losses through undesired currents in the substrate, or by the serial resistance of the inductor windings. In digital CMOS technologies, the thickness of the metal layers is much smaller than in bipolar and bi-CMOS technologies, thus leading to much higher serial resistances. Further the substrates are highly doped, thus leading to large substrate losses. Digital CMOS technologies allow the integration of both digital and analog functions on the same chip without exponentially increasing the cost of digital CMOS technology fabrication.

Moreover, conventional VCOs require a large die size, have low linearity, and have no signal modulation capability. The parasitic effects of the physical layout increase the variability of the set-on oscillator frequency. As such, oscillator frequency cannot be reliably predicted.

Therefore, desirable in the art of VCO designs are improved VCO designs with a smaller footprint, lower circuit parasitics, higher linearity, improved set-on oscillator frequency stability and multiple frequency band capability incorporated thereto.

SUMMARY

In view of the foregoing, a voltage controlled oscillator system is provided to improve frequency stability and system linearity. A symmetrical voltage controlled oscillator system embodying the present invention comprises a frequency tuning circuit for receiving a frequency tuning signal, a band tuning circuit coupled with the frequency tuning circuit in a parallel fashion having at least one switching circuit for receiving at least one band tuning signal and at least one switching signal, a core circuit coupled with the frequency tuning circuit and the band tuning circuit for providing a first output and a second output that are complementary to each other, wherein the core circuit has at least one inductance module coupled with the band tuning circuit for providing a predetermined inductance, wherein upon asserting the switching signal, and upon adjusting the frequency tuning signal and the band tuning signal, the switching circuit is enabled for configuring the band tuning circuit to join the frequency tuning circuit for determining a predetermined output frequency based on a total inductance and total capacitance provided by the core circuit, the frequency tuning circuit and the band tuning circuit, and wherein all elements of the voltage controlled oscillator system are arranged in a substantially symmetrical fashion.

The construction and method of operation of the invention, however, together with additional objects and advantages thereof will be best understood from the following description of specific embodiments when read in connection with the accompanying drawings.

DESCRIPTION

The following will provide a detailed description of several improved VCO circuits embodying the features of the present invention.

Figure 1:
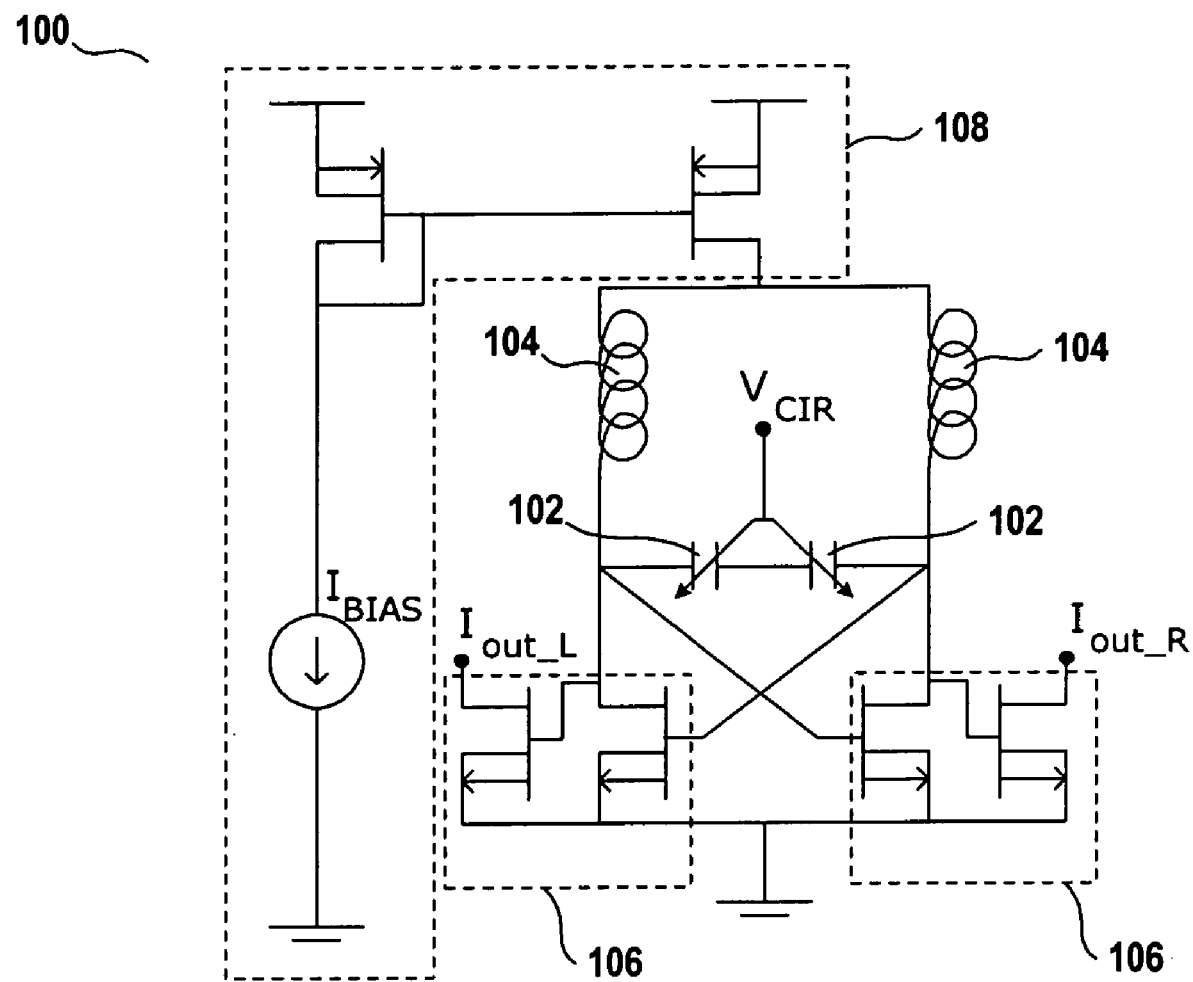
FIG. 1 presents a conventional LC tank VCO circuit.

FIG. 1 presents a conventional LC tank VCO circuit 100. The circuit 100 comprises two varactors 102, two inductors 104, two NMOS cross-coupled MOSFET structures 106, and a constant current power source 108. The NMOS cross-coupled MOSFET structures 106 provide the necessary negative resistance to cancel the loss of the resonator. According to the Barkhaussen rule, oscillations occur when the loop gain is larger than one and when the image portion of the impedance is zero. The VCO oscillation frequency is determined by the equation:

$$f = 1/2\pi(LC)^{1/2}$$

where L is the total inductance of the two inductors 104, and C is the network capacitance comprising the capacitance of the two varactors 102 and a circuit parasitic capacitance.

Since this design does not utilize a symmetrical topology, the parasitic capacitances could be quite large and indeterminable. Thus, the VCO output frequency can not be predicted with any accuracy with a large parasitic capacitance of the circuit 100. It is noted that the circuit 100 does not have a built-in modulation capability, and therefore requires an external modulation circuit. The circuit 100 also has low linearity, thereby producing additional flicker noise in the output. Due to the asymmetrical topology of this design, even-mode harmonics are not suppressed. Because of the above factors, the loaded quality factor of the total LC tank circuit cannot be predicted reliably and accurately.

Figure 2:
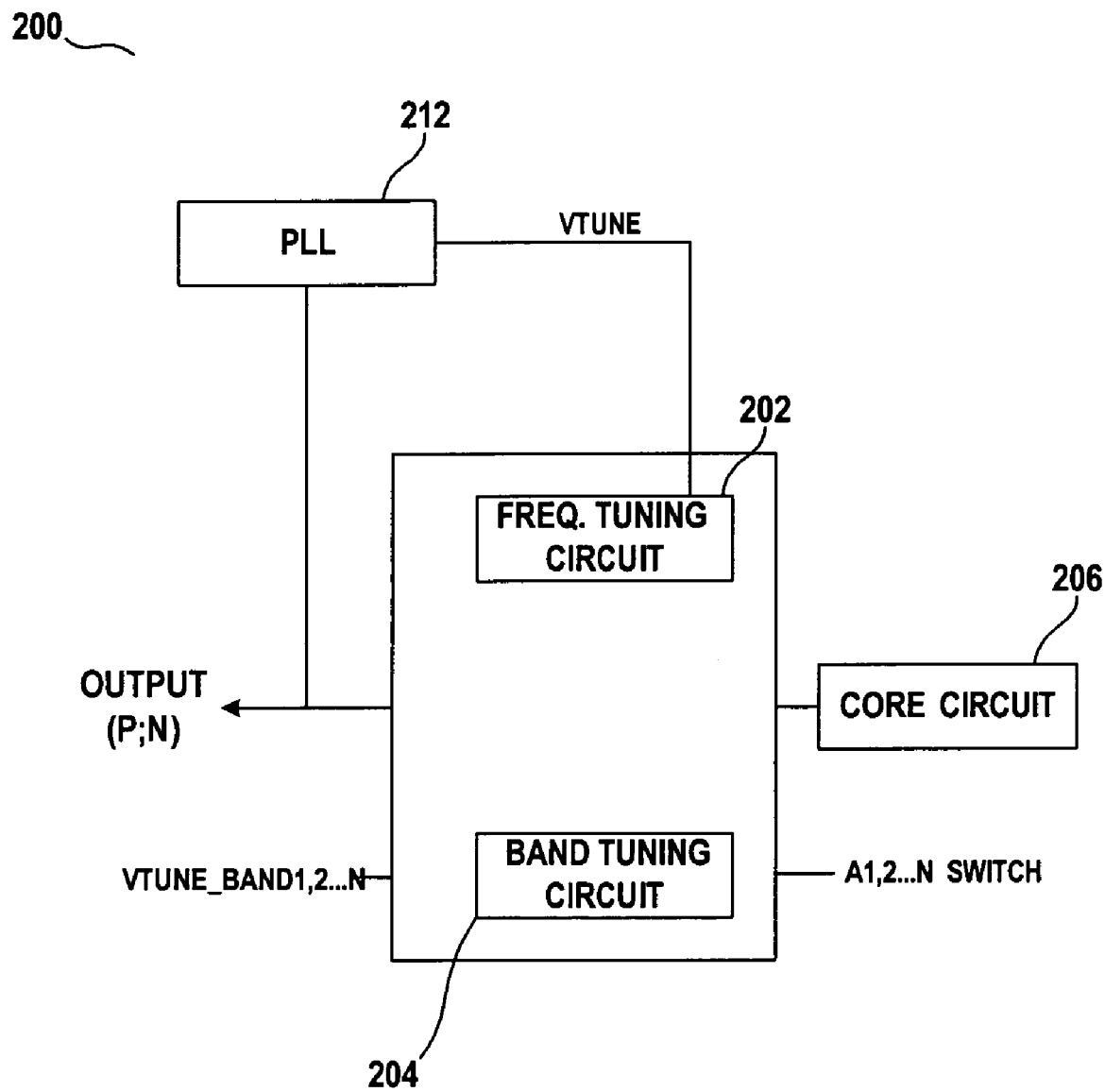
FIG. 2 presents a block diagram of a high-linearity symmetrical LC tank VCO system in accordance with one embodiment of the present invention.

FIG. 2 presents a block diagram of a high-linearity, signal-modulated symmetrical LC tank VCO system 200 in accordance with one embodiment of the present invention. The system 200 comprises a frequency tuning circuit 202, a frequency band tuning circuit 204, a core circuit 206, and VCO outputs such as the complimentary OUTPUT_P and OUTPUT_N. The VCO outputs are at a particular output frequency. The combination of the frequency tuning circuit 202 and the band tuning circuit 204 collectively control the output frequency. Conceptually, the circuit 202 provides a first layer of frequency tuning, while the band tuning circuit 204 further provides another layer of frequency tuning, which together determined the output frequency and phase generated by the VCO system 200. The frequency tuning circuit 202, the band tuning circuit 204, and the core circuit 206 may be collectively referred to as a VCO circuit or VCO in short. In order to stabilize the output frequency and its phase, an optional phase-locked feedback mechanism may be deployed using a VTUNE feedback signal, which provides a feedback voltage in this embodiment. The level of this feedback voltage is dependent upon the type of varactors in the frequency tuning circuit. Typical types include PN-junction, standard mode p/nMOS, or accumulation mode p/nMOS. A phase-lock loop (PLL) module 212, external to the VCO provides the VTUNE signal based on the output of the VCO circuit. The PLL module 212 provides precise VCO output frequency control as well as phase control by varying the voltage that changes the varactor's capacitance.

In the band tuning circuit 204, one or more frequency bands can be selected/enabled by receiving one or more switching signals ("A1 SWITCH", "A2 SWITCH" . . . "AN SWITCH") to enable certain circuitries. The band tuning signal VTUNE_BAND and the switching signals together fine tune the frequency. For example, if there are multiple band tuning signals ("VTUNE_BAND1", "VTUNE_BAND2" . . . "VTUNE_BANDN"), when the "A2 SWITCH" signal is asserted, a corresponding frequency band controlled by the variable voltage level of the VTUNE_BAND2 signal determines a range of the output frequency. Depending upon the VCO circuit design, the VCO may contain just one or multiple frequency bands.

In essence, through the control of various tuning related signals such as VTUNE, VTUNE_BAND, and Ax Switch, the total capacitance of the LC tank is altered, the output oscillation frequency will then be changed. The magnitude of the output in either case is largely determined by the quality factor Q of the circuit.

Figure 3:
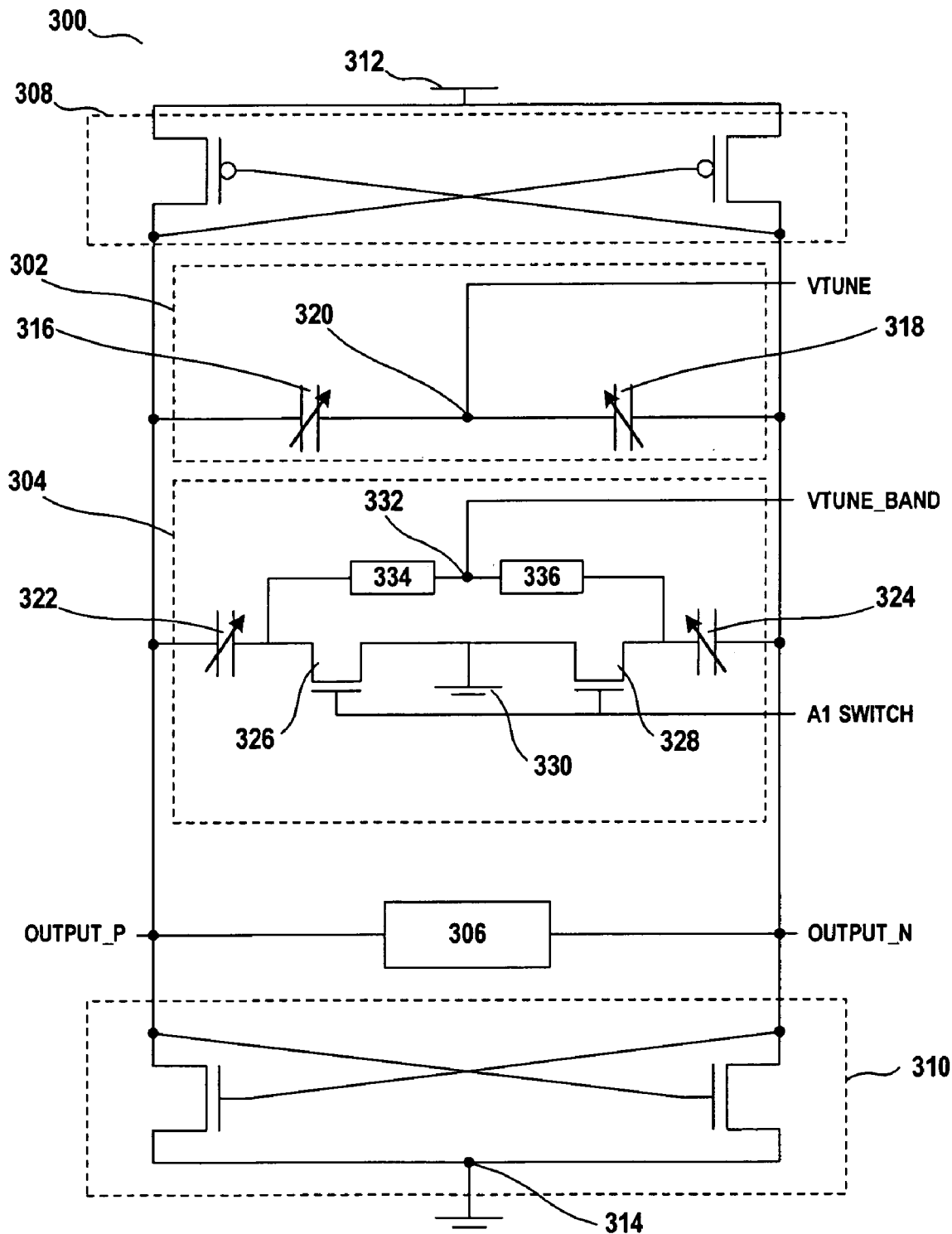
FIG. 3 presents detailed view of a symmetrical LC tank VCO circuit in accordance with another embodiment of the present invention.

FIG. 3 presents a symmetrical LC tank VCO circuit 300 in accordance with the first embodiment of the present invention. The circuit 300 includes a frequency tuning circuit 302, a band tuning circuit 304 having at least one switching circuit, an inductance module such as a simple inductor 306, a PMOS cross-coupled transistor structure 308, a NMOS cross-coupled transistor structure 310, a power source 312, and VCO outputs OUTPUT_P and OUTPUT_N. The combination of the inductance device, the cross-coupled transistor structures 308 and 310 coupled to two power sources 312 and 314 (e.g., VCC and VSS or GND) can be seen as a core circuit. The inductor 306 is coupled to the two outputs directly and is coupled to the band tuning circuit and other circuit modules in a parallel fashion. From a manufacturing perspective, the circuit 300 can be fabricated on a semiconductor substrate such as a P-type substrate using standard CMOS fabrication processes.

The circuit 300 receives its power from the power source 312, and is tied to the device ground at a node 314. The circuit 300 has an excellent symmetry in that the circuit elements of the cross-coupled transistor structures 308 and 310, the frequency tuning circuit 302, the band tuning circuit 304, and the inductance module such as an inductor 306 are symmetrically arranged. Comparing with conventional VCO designs, these symmetrical VCO designs reduce the even-mode VCO harmonics and any flicker noise to be up converted and reduce the circuit parasitics in the VCO outputs. Further, the continuous output provides a better signal quality and reduces signal distortion and noise generation that is common in conventional VCO designs.

The frequency tuning circuit 302 is a simple non-modulating frequency tuning circuit including MOS varactors 316 and 318. The varactors 316 and 318 are coupled in series, with their first ends coupled with the first and second outputs respectively, and their second ends coupled with the frequency tuning signal VTUNE. If a phase lock mechanism is deployed, the VTUNE can be a feedback signal from a PLL module, and the output frequency and phase are locked by the feedback signal VTUNE which is received by the circuit 300 at a mid point between the varactors 316 and 318 at node 320.

The band tuning circuit 304 provides the capability to adjust the output frequency by switching in the tuning modules such as varactors 322 and 324 as well as to continuously tune the output frequency by varying the voltage across the varactors 322 and 324. The tuning modules can be predetermined capacitance device such as varactors or MOS capacitors. The band tuning circuit is coupled to the frequency tuning circuit in a parallel fashion. The frequency band can be enabled by a "A1 SWITCH" signal that activates MOS transistor switches 326 and 328, thereby connecting the varactors 322 and 324. The "A1 SWITCH" signal is generated by circuits external to the circuit 300 that controls the desired frequency band of the circuit 300. The "A1 SWITCH" signal supplies a voltage to the gate of the switches 326 and 328 to activate the switches and activate the varactors 322 and 324 to provide a pre-selected frequency band. It is noted that the sources of the switches 326 and 328 are tied to ground at a node 330. If it is not physically connected to ground, it still provide a virtual AC ground there as it is positioned in the middle of the circuit 300, which is in a differential mode. This arrangement reduces the serial resistance of the LC tank and further increases the quality factor of the circuit 300.

In addition to the frequency tuning circuit 302, which contributes to the tuning of the output frequency, the band tuning circuit 304 provides further control mechanism for the frequency tuning. Within the band tuning circuit 304, a band tuning signal, VTUNE_BAND, provided at a predetermined voltage level, supplies a substantially stable voltage to a node 332 between the resistors 334 and 336. The voltages are thus applied indirectly to the varactors 322 and 324 through the resistors 334 and 336, respectively, to vary the capacitance of the varactors and hence the VCO output frequency. The voltage level applied by VTUNE_BAND is determined by various factors, one of which is the type of varactors in the band tuning circuit 304. In addition, the resistor 334 and the varactor 322, similar as the resistor 336 and the varactor 324, is an integrated differential low-pass filter, which can be helpful to eliminate external noise.

The circuit 300 is substantially symmetrical as almost all of the circuit elements are placed in a symmetrical fashion. For example, the cross-coupled transistor structures 308 and 310 of the core circuit are coupled in parallel to the band tuning circuit and the frequency tuning circuit, all being symmetrical. For illustration purposes, imagine there is a virtual center line (not shown), which coincides with the power source node 312, node 320, node 332, the virtual ground 330, and ground node 314, it can be seen that all circuit elements are placed in the symmetrical manner. As shown, there is at least one PMOS cross-coupled transistor structure 308 having at least a pair of cross-coupled PMOS transistors with sources thereof coupled to a power source. Similarly, there is at least one NMOS cross-coupled transistor structure having at least a pair of cross-coupled NMOS transistors with sources thereof coupled to an electrical ground such as GND or VSS of the circuit. The drains of the PMOS and NMOS transistors are coupled to at least one output, either the first OUTPUT_P or the second OUTPUT_N outputs. The cross-couple arrangement is such that a gate of a PMOS or NMOS transistor is cross-coupled to a drain of another PMOS or NMOS transistor of the corresponding pair.

The cross-coupling transistor structures provide the necessary negative resistance to increase power for compensating the losses of the LC resonator tank (which includes the inductor and the capacitance providing frequency tuning circuit and the band tuning circuit) that is parallel thereto. Also, a proper choice of the electrical characteristics of these cross-coupling transistor structures 308 and 310 significantly reduces the up-conversion of flicker noise. It is understood that this design of the VCO circuit provides the integration of the varactors 316, 318, 322, and 324 with the inductor 306 to form a symmetrical VCO LC tank. The proper symmetrical design of these components will reduce the inductor and circuit parasitic capacitance, thereby increasing the oscillation efficiency.

One advantage of the band tuning circuit 304 is that the output frequency variations created by process and temperature variations are adequately compensated, thereby resulting in an accurate and stable output frequency across the entire frequency band. Another advantage is the continuous and accurate signal tuning range of the circuit and the continuous analog output. The continuous analog output provides a better signal quality and reduces the signal distortion and noise generation that is typical in conventional VCO designs. In this design, since only a one-bit varactor is required for the frequency tuning circuit, multiple bit frequency tuning circuits are not needed, thereby reducing the required die size. Yet another advantage of the band tuning circuit 304 is its layout symmetry, which provides a stable output frequency and reduced parasitic effects. Yet another advantage of this design is the built-in differential low-pass filter realized by two pairs of resistors-varactors: the resistor 334 and the varactor 322, and the resistor 336 and the varactor 324. This differential low-pass filter is used to eliminate external noise. Yet another advantage of this design is the AC virtual ground at the node 330 at the mid point of the circuit 300 reduces the series resistance of the LC tank circuit, thus improving the quality factor of the LC tank. Finally, this design allows for precise loaded quality factor prediction, while any layout parasitic effects can be easily compensated for and eliminated.

It is understood by one skilled in the art that the relationship of the output frequency and the capacitance and inductance of the VCO circuit can be mathematically represented as:

$$f \propto 1/(L(C1+C2))^{1/2}$$

wherein C1 is the total capacitance of the frequency tuning circuit 302 and C2 is the total capacitance of the band tuning circuit 304, and L represents the inductance provided largely by the inductance device 306. As shown, the frequency tuning is collectively controlled by the alteration of C1 and C2 assuming L is largely unchanged. Also, C1 is contributed by the varactor 316 and 318, which can be the same or different varactors as the design may be. Similarly, C2 is contributed by the varactor 322 and 324, which again can be the same or different so that the frequency tuning can be done in various ways. For example, the varactors 316 and 318 can be set at values between 0.25 p to 1 p, and the varactor 322 can be adjusted to be a predetermined capacitance while the varactor 324 can be set at one quarter, one half, three fourth of that predetermined capacitance to tune the frequency.

Figure 4:
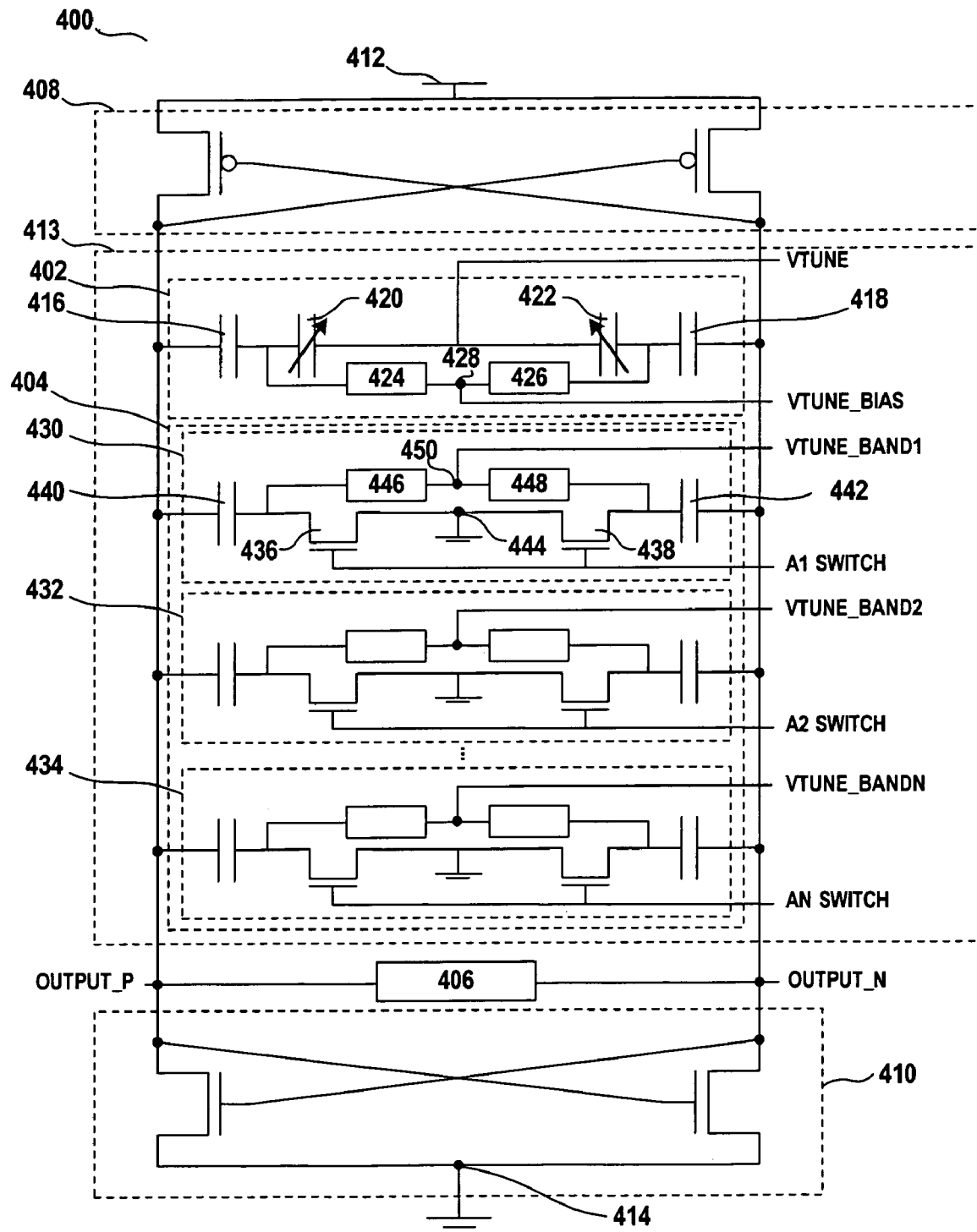
FIG. 4 presents detailed view of a symmetrical LC tank VCO circuit in accordance with another embodiment of the present invention.

FIG. 4 presents a symmetrical LC tank VCO circuit 400 in accordance with the second embodiment of the present invention. The circuit 400 incorporates a tuning structure with multiple tuning bands, and includes a frequency tuning circuit 402, a band tuning circuit 404 having one or more switching circuits, and a core circuit having an inductor 406, a PMOS cross-coupled transistor structure 408, and a NMOS cross-coupled transistor structure 410. The VCO circuit 400 provides two complementary outputs: OUT- PUT_P and OUTPUT_N. The combination of the frequency tuning circuit 402 and the band tuning circuit 404 can be viewed as a frequency circuit 413 controlling the output frequency and its phase. The circuit 400 receives its power from a power source 412, and is tied to another one such as the device ground at a node 414. It is understood that the circuit 400 can be fabricated on a P-type substrate using standard CMOS fabrication processes.

The frequency tuning circuit 402 contributes to the control of the output frequency and phase. The output frequency and phase is locked by the frequency tuning signal, VTUNE. If a phase lock feature is to be implemented, VTUNE can be a feedback signal from a phase-lock loop (PLL) module external to the circuit 400. The PLL receives the output of the VCO circuit 400 and adjusts the value of VTUNE to lock the frequency and the phase of the output.

Capacitors 416 and 418 are in series with varactors 420 and 422, respectively, thereby increasing circuit linearity. In the frequency tuning circuit 402, the capacitors 416 and 418 are also in series with resistors 424 and 426, respectively. The resistor 424 and the capacitor 416, like the resistor 426 and the capacitor 418, can be seen as an integrated differential low-pass filter that is used to eliminate external noise. It is noted that the resistors 424 and 426 have a mid point node 428, which is further tied to a frequency tuning bias signal VTUNE_BIAS as shown. In fact, in the AC world, it is a virtual ground as the frequency tuning circuit is arranged in a differential mode. This virtual ground as positioned helps to produce circuit symmetry and further reduces the series resistance of the LC tank, and thereby increasing the quality factor of the circuit 400.

The band tuning circuit 404 incorporates a tuning structure with multiple tuning bands to provide the capability to tune the output frequency by switching in specific sets of capacitors, thereby changing the LC tank total capacitance value. As shown in FIG. 4, the band tuning circuit 404 has capacitive switching circuits 430, 432 and 434. The "Ax SWITCH" (where x is 1, 2, . . . N) is an enabling signal for various capacitive switching circuits, and can be generated by a circuit, not shown, that is external to the circuit 400.

It is further understood that one or more capacitive switching circuits may be enabled at any one time to help tuning the desired output frequency. For example, for the capacitive switching circuit 430, an "A1 SWITCH" signal supplies a predetermined voltage to the gate of transistors 436 and 438, thereby activating the transistors 436 and 438 and switching capacitors 440 and 442 in, to help tuning the output frequency. It is understood that the transistors can be either NMOS or PMOS devices. As more switching circuits are enabled, more capacitors are added to the LC tank of the VCO circuit, and the output frequency tuning is affected by all these capacitors involved. The transistors 436 and 438 are connected together via a node 444, which further connects to ground. This node 444 can be a virtual AC ground as it is positioned. This arrangement reduces the series resistance of the LC tank, thereby increasing the quality factor of the circuit 400. The capacitors 440 and 442 are in series with resistors 446 and 448, respectively. The resistor 446 and the capacitor 440, like the resistor 448 and the capacitor 442, can be seen as an integrated differential low-pass filter that is used to eliminate external noise. A VTUNE_BAND1 signal is connected to a predetermined voltage source, not shown, that is external to the circuit 400. This signal supplies a predetermined voltage to a node 450 to bias the drains of the transistors 436 and 438 through the resistors 446 and 448. Other capacitive switching circuits 432 and 434 receive respectively "A2 SWITCH" and "AN SWITCH" signals, and operate identically as the circuit 430. Although this embodiment presents three capacitive switching circuits, more or fewer capacitive switching circuits may be utilized to satisfy the system requirements.

One advantage of the frequency tuning circuit 402 is its excellent linearity. The series coupling between the capacitors 416 and 418 and the varactors 420 and 422, respectively, increase the linearity of the frequency tuning circuit 402. A second advantage is the excellent symmetry of all circuit elements of the circuit 400. In the circuit 400, the cross-coupled transistor structures 408 and 410, the design of the inductor 406, the frequency tuning circuit 402 and the band tuning circuit 404 are all substantially symmetrical. The symmetry of this design reduces the even-mode VCO harmonics and also reduces the flicker noise in the VCO output to be up converted, compared to conventional VCO designs. This symmetry significantly reduces the parasitic capacitances within the circuit, thereby providing output frequency stability and output frequency set-on accuracy during the design stage. The output provides a better signal quality and reduces the signal distortion and noise generation that is contained in conventional VCO designs. Third, the built-in low pass filter eliminates the external noise without additional components. Another advantage of this embodiment is that the output frequency variations created by process and temperature variations are compensated for by the band tuning circuit 404, thereby resulting in an accurate and stable oscillator frequency. Comparing with conventional designs that use asymmetrical inductors, this new design can improve output voltage swing and phase noise significantly (e.g., 65% and 2.3 dB respectively), for a given level of power consumption. At the same time, the required chip area can be reduced as much as 36%, compared to conventional inductor designs.

Figure 5A:
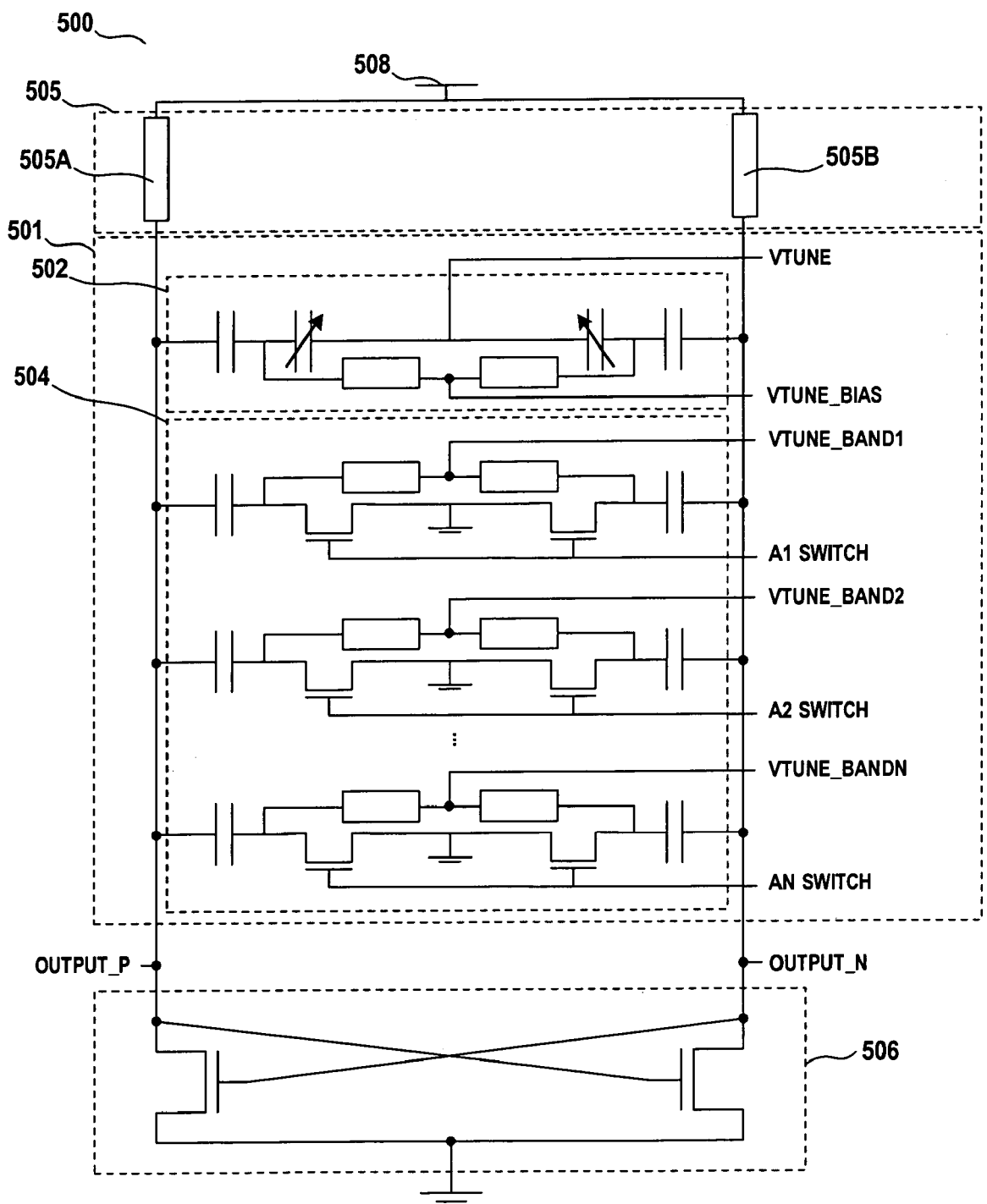
FIGS. 5A and 5B present two symmetrical LC tank VCO circuit in accordance with another embodiment of the present invention.
Figure 5B:
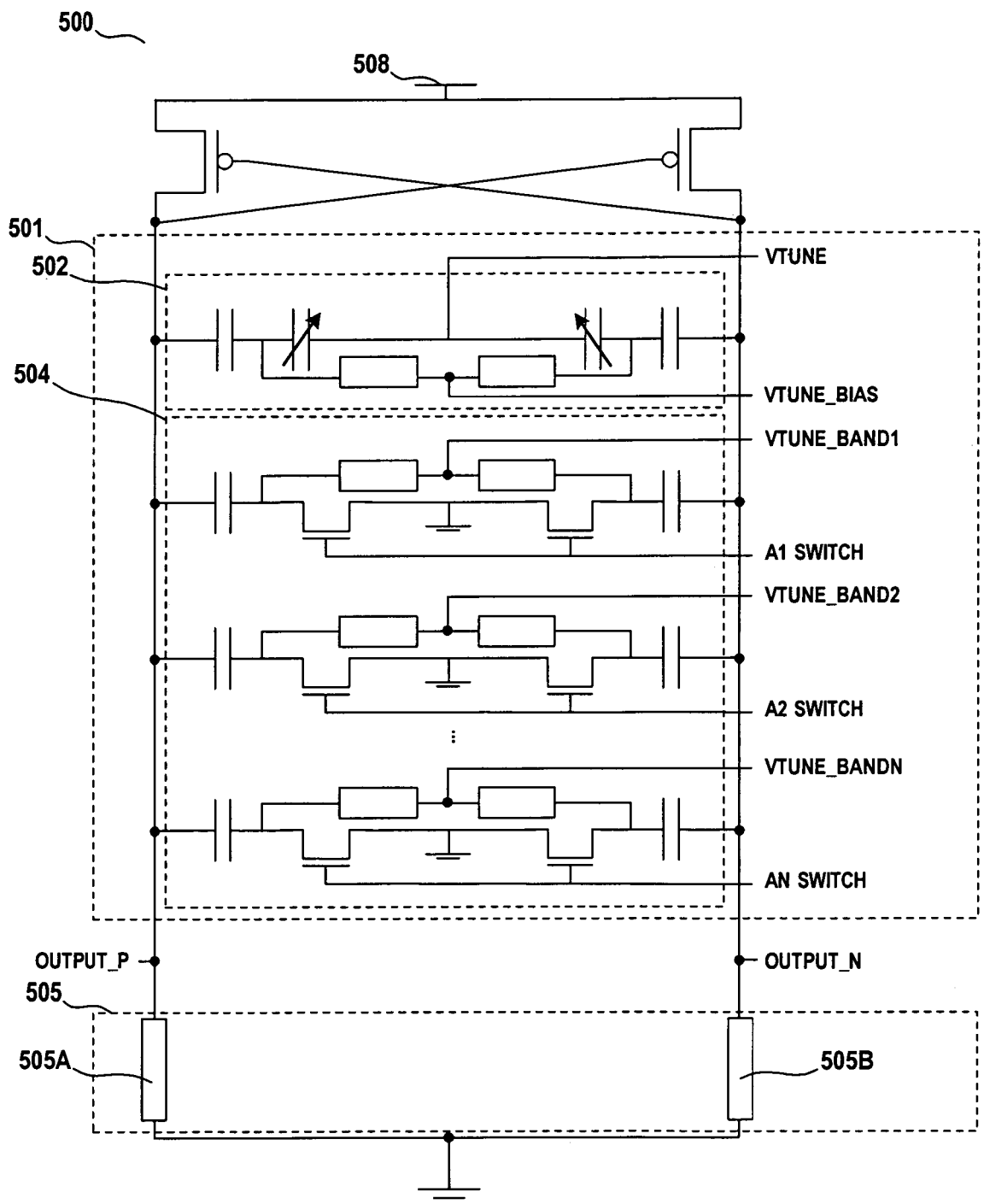

FIG. 5A presents another symmetrical LC tank VCO circuit 500 in accordance with another embodiment of the present invention. The circuit 500 incorporates a tuning structure with multiple tuning bands, and implements a frequency circuit 501, which includes a frequency tuning circuit 502 and a band tuning circuit 504. Unlike the circuit 400, however, the output portion of the circuit 500 incorporates a divided inductor structure 505, with two symmetrical inductors 505A and 505B aligned respectively in series with the VCO outputs OUTPUT_P and OUTPUT_N. Also, the PMOS cross-coupled transistor structure 408 has been eliminated, leaving only a NMOS cross-coupled transistor structure 506 that is identical to the NMOS cross-coupled transistor structure 410. FIG. 5B is similar to FIG. 5A except that the two symmetrical inductors 505A and 505B connect between the two outputs and ground while the PMOS cross-coupled transistor structure is coupled to the power source. In this embodiment, the NMOS cross-coupled transistor structure is eliminated. It is understood that the circuit 500 is fabricated on a semiconductor substrate using standard CMOS fabrication processes, and has the same performance characteristics and advantages as the circuit 400.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A Symmetrical voltage controlled oscillator system comprising:
   a frequency tuning circuit for receiving a frequency tuning signal;
   a band tuning circuit coupled with the frequency tuning circuit in a parallel fashion having at least one switching circuit for receiving at least one band tuning signal and at least one switching signal;
   a core circuit coupled with the frequency tuning circuit and the band tuning circuit for providing a first output and a second output that are complementary to each other, the core circuit having at least one inductance module for providing a predetermined inductance, wherein the band tuning circuit includes:
   a first and a second tuning modules having a first and a second predetermined capacitances coupled to the first and second outputs on their first ends respectively;
   a first and a second resistors coupled in a series and further coupled serially between second ends of the first and second tuning modules with a mid point between the two resistors controlled by the band tuning signal:
   a first and a second switches coupled in series and further coupled serially between seconds ends of the first and second tuning modules, and
   wherein when the switching signal is applied to gates of the switches, the first and second tuning modules are enabled,
   wherein upon asserting the switching signal, the switching circuit is enabled for configuring the band tuning circuit to join the frequency tuning circuit for determining a predetermined output frequency based on a total inductance and total capacitance provided by the core circuit, the frequency tuning circuit and the band tuning circuit upon adjusting the frequency signal, and the band tuning signal, and
   wherein all elements of the voltage controlled oscillator system are arranged in a substantially symmetrical fashion.

2. The system of claim 1, wherein the frequency tuning signal of the frequency tuning circuit is provided by a phased-lock frequency synthesizer for locking a phase of the outputs.

3. The system of claim 1 wherein the core circuit further includes:
   at least one PMOS cross-coupled transistor structure having at least a pair of cross-coupled PMOS transistor structure having at least a pair of cross-coupled PMOS transistors with sources thereof to a power source; and
   at least one NMOS cross-coupled transistor structure having at least a pair cross-coupled NMOS transistors with sources thereof coupled to an electrical ground,
   wherein drains of the PMOS and NMOS transistors are coupled to either the first or second outputs,
   wherein a gate of a PMOS or NMOS transistor is cross-coupled to a drain of another PMOS or NMOS transistor of the corresponding pair, and
   the inductance module is coupled in a parallel fashion to the frequency tuning circuit and the band tuning circuit and between the first and second outputs.

4. The system of claim 1 wherein the core circuit further includes:
   at least one NMOS cross-coupled transistor structure having at least a first and second cross-coupled NMOS transistors with sources thereof coupled to an electrical ground, and drains thereof coupled to the first or second output, wherein gates of the first and second NMOS transistor are cross-coupled to drains of the second and first NMOS transistor respectively, and
   wherein the inductor module has a first inductance module coupled between a power source and the first output, a second inductance module coupled between the power source and the second output.

5. The system of claim 1, wherein the frequency tuning circuit further includes:
   a first varactor and a second varactor coupled in series, wherein their first ends are coupled with the first and second outputs respectively, and their second ends are coupled with the frequency tuning signal.

6. The system of claim 5, wherein the frequency tuning circuit further includes:
   a first resistor and a second resistor coupled in series and together couple in parallel fashion with the first and second varactors; and
   a first capacitor and a second capacitor coupled to the first and the second outputs on their first ends respectively and coupled to the first and second varactors as well as the first and second resistors on their second ends respectively, thereby connecting with the varactors as well as the resistors in a serial fashion.

7. The system of claim 6 wherein with a mid point between the first and second resistors is coupled to a frequency tuning bias signal.

8. The system of claim 1 wherein a mid point between the two switches is coupled to an electrical ground.

9. The system of claim 1, wherein the tuning modules are varactors.

10. The system of claim 1, wherein the tuning modules are MOS capacitors.

11. A symmetrical voltage controlled oscillator system comprising:
    a frequency tuning circuit for receiving a frequency tuning signal and a frequency tuning bias signal;
    a band tuning circuit coupled with the frequency tuning circuit in a parallel fashion having at least one switching circuit for receiving at least one band tuning signal and at least one switching signal;
    a core circuit coupled with the frequency tuning circuit and the band tuning circuit for providing a first output and a second output that are complementary to each other, the core circuit having at least one inductance module for providing a predetermined inductance, wherein the frequency tuning circuit further includes:
    a first varactor and a second varactor coupled in series, wherein their first ends are coupled with the first and second outputs respectively, and their second ends are coupled with the frequency tuning signal;
    a first resistor and a second resistor coupled in series and together coupled in a parallel fashion with the first and second varactors, a mid point between the first and second resistors being coupled to the frequency tuning bias signal; and
    a first capacitor and a second capacitor coupled to the first and the second outputs on their first ends respectively and coupled to the first and second varactors as well as the first and second resistors on their second ends respectively, thereby connecting with the varactors as well as the resistors in a serial fashion, and wherein upon asserting the switching signal, the switching circuit is enabled for configuring the band tuning circuit to join the frequency tuning circuit for determining a predetermined output frequency based on a total inductance and total capacitance provided by the core circuit, the frequency tuning circuit and the band timing circuit upon adjusting the frequency tuning signal, the frequency tuning bias signal, and the band tuning signal, and wherein all elements of the voltage controlled oscillator system are arranged in a substantially symmetrical fashion.

12. The system of claim 11, wherein the frequency tuning signal of the frequency tuning circuit is provided by a phased-lock frequency synthesizer for locking a phase of the outputs.

13. The system of claim 11 wherein the core circuit further includes:

at least one PMOS cross-coupled transistor structure having at least a pair of cross-coupled PMOS transistors with sources thereof coupled to a power source; and at least one NMOS cross-coupled transistor structure having at least a pair of cross-coupled NMOS transistors with sources thereof coupled to an electrical ground, wherein drains of the PMOS and NMOS transistors are coupled to either the first or second outputs, wherein a gate of a PMOS or NMOS transistors is cross-coupled to a drain of another PMOS or NMOS transistor of the corresponding pair, and the inductance module is coupled in a parallel fashion to the frequency tuning circuit and the and tuning circuit and between the first and second outputs.

14. The system of claim 11 wherein the core circuit further includes:

at least one NMOS cross-coupled NMOS transistors with sources thereof coupled to an electrical ground, and drains thereof coupled to the first or second output, wherein gates of the first and second NMOS transistor are cross-coupled to drains of the second and first NMOS transistors respectively, and wherein the inductor module has a first inductance module coupled between a power source and the first output, a second inductance module coupled between the power source and the second output.

15. The system of claim 11, wherein the band tuning circuit further includes:

a first and second tuning modules having a first and second predetermined capacitances coupled to the first and second outputs on their first ends respectively, a first and second resistors coupled in series and further coupled serially between second ends of the first and second tunig modules with a mid point between the two resistors controlled by the band tuning signal; and a first and a second switches coupled in series and further coupled serially between second ends of the first and second tuning modules, and wherein when the switching signal is applied to gates of the switches, the first an second tuning modules are enabled.

16. A symmetrical voltage controlled oscillator system comprising:

a frequency tuning circuit for receiving a frequency tuning signal and a frequency tuning bias signal;

a phased-lock frequency synthesizer for providing the frequency timing signal;

a band tuning circuit coupled with the frequency tuning circuit in a parallel fashion having at least one switching circuit for receiving at least one band tuning signal and at least one switching signal;

a core circuit coupled with the frequency tuning circuit and the band tuning circuit for providing a first output and a second output that are complementary to each other, the core circuit having at least one inductance module for providing a predetermined inductance, wherein the frequency tuning circuit further includes:

a first varactor and a second varactor coupled in series, wherein their first ends are coupled with the first and second outputs respectively, and their second ends are coupled with the frequency tuning signal;

a first resistor and a second resistor coupled and together coupled in a parallel fashion with the first and second varactors, a mid point between the first and second resistors being coupled to the frequency tuning bias signal; and a first capacitor and a second varactor coupled to the first and the second outputs on their first ends respectively and coupled to the first and second varactors as well as the first and second resistors on their second ends respectively, thereby connecting with the varactors as well as the resistors in a serial fashion, and wherein upon asserting the switching signal, the switching circuit is enabled for configuring the band tuning circuit to join the frequency tuning circuit for determining a predetermined output frequency based on a total inductance and total capacitance provided by the core circuit, the frequency tuning circuit and the and tuning circuit upon adjusting the frequency tuning signal, the frequency tuning bias signal, and the and tuning signal, and wherein all elements of the voltage controlled oscillator system are arranged in a substantially symmetrical fashion.

17. The system of claim 16, wherein the band tuning circuit further includes:

a first and a second timing modules having a first and a second predetermined capacitances coupled to the first and second outputs on their first ends respectively, a first and second resistors coupled in series and further coupled serially between second ends of the first and second tuning modules with a mid point between the two resistors controlled by the band tuning signal; and a first and a second switches coupled in series and further coupled serially between second ends of the first and second tuning modules, and wherein when the switching signal is applied to gates of the switches, the first and second tuning modules are enabled.

* * * * *